United States Patent
Yamada et al.

(10) Patent No.: US 9,517,738 B2
(45) Date of Patent: Dec. 13, 2016

(54) GROUNDING SHOE AND VEHICLE

(71) Applicant: MITSUBISHI HEAVY INDUSTRIES, LTD., Tokyo (JP)

(72) Inventors: Shigeyuki Yamada, Tokyo (JP); Kousuke Katahira, Tokyo (JP); Hiroyuki Andoh, Oita (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 211 days.

(21) Appl. No.: 14/401,369

(22) PCT Filed: Apr. 26, 2013

(86) PCT No.: PCT/JP2013/062390
§ 371 (c)(1),
(2) Date: Nov. 14, 2014

(87) PCT Pub. No.: WO2013/187142
PCT Pub. Date: Dec. 19, 2013

(65) Prior Publication Data
US 2015/0131192 A1    May 14, 2015

(30) Foreign Application Priority Data

Jun. 12, 2012  (JP) .................................. 2012-132980

(51) Int. Cl.
*H05F 3/00*   (2006.01)
*B60R 16/06*  (2006.01)
(Continued)

(52) U.S. Cl.
CPC ................ *B60R 16/06* (2013.01); *H01R 4/64* (2013.01); *H01R 13/6485* (2013.01);
(Continued)

(58) Field of Classification Search
USPC .................................................. 361/212, 220
See application file for complete search history.

(56) References Cited

U.S. PATENT DOCUMENTS

| 4,168,770 A | 9/1979 | Segar et al. | |
| 5,673,774 A * | 10/1997 | Trapp | B60L 5/39 191/49 |
| 6,382,378 B1 * | 5/2002 | Cornic | B60M 1/10 191/14 |

FOREIGN PATENT DOCUMENTS

| CN | 102107609 A | 6/2011 |
| JP | 51-19572 B | 6/1976 |

(Continued)

OTHER PUBLICATIONS

International Search Report mailed Jul. 16 2013 in International Application No. PCT/JP2013/062390, filed Apr. 26, 2013.
(Continued)

*Primary Examiner* — Danny Nguyen
(74) *Attorney, Agent, or Firm* — Kanesaka Berner and Partners LLP

(57) ABSTRACT

A grounding shoe is provided in a vehicle so as to face a grounding rail provided on a track. The grounding shoe includes a collector unit that has an electroconductive body; and a holding part that fixes the collector unit by holding a first end of the electroconductive body in such a manner that the electroconductive body can be energized as well as attached/detached and that is in contact with the electroconductive body.

20 Claims, 13 Drawing Sheets

(51) Int. Cl.
*H01R 4/64* (2006.01)
*H01R 13/648* (2006.01)
*H01R 41/02* (2006.01)
*H05K 9/00* (2006.01)

(52) U.S. Cl.
CPC ........... *H01R 41/02* (2013.01); *H05K 9/0067* (2013.01); *H05K 9/0079* (2013.01)

(56) References Cited

FOREIGN PATENT DOCUMENTS

| | | |
|---|---|---|
| JP | 57-43470 B2 | 9/1982 |
| JP | 59-20981 A | 2/1984 |
| JP | 6-62467 U | 9/1994 |
| JP | 2010-252153 A | 11/2010 |
| JP | 2010-259167 A | 11/2010 |
| JP | 2010254040 A | 11/2010 |
| JP | 5119572 B2 | 1/2012 |

OTHER PUBLICATIONS

Written Opinion mailed Jul. 16, 2013, corresponding to PCT/JP2013/062390.
Office Action in CN Application No. 20130028848.9, mailed Jan. 25, 2016.

\* cited by examiner

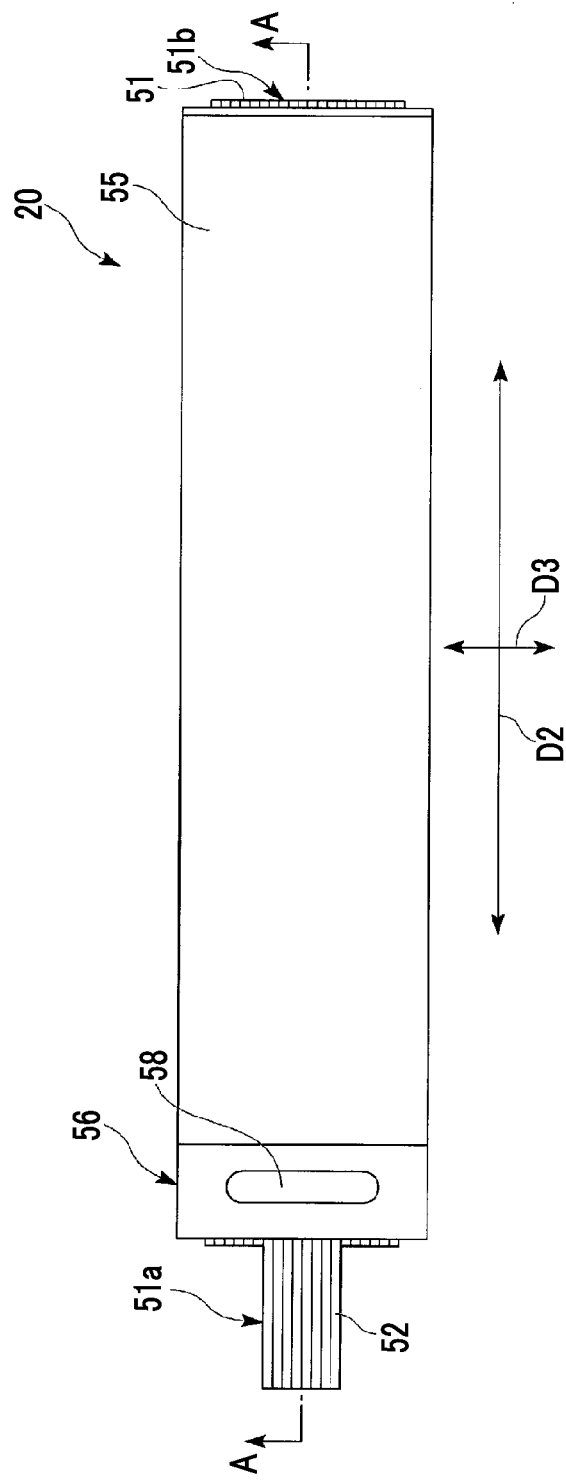

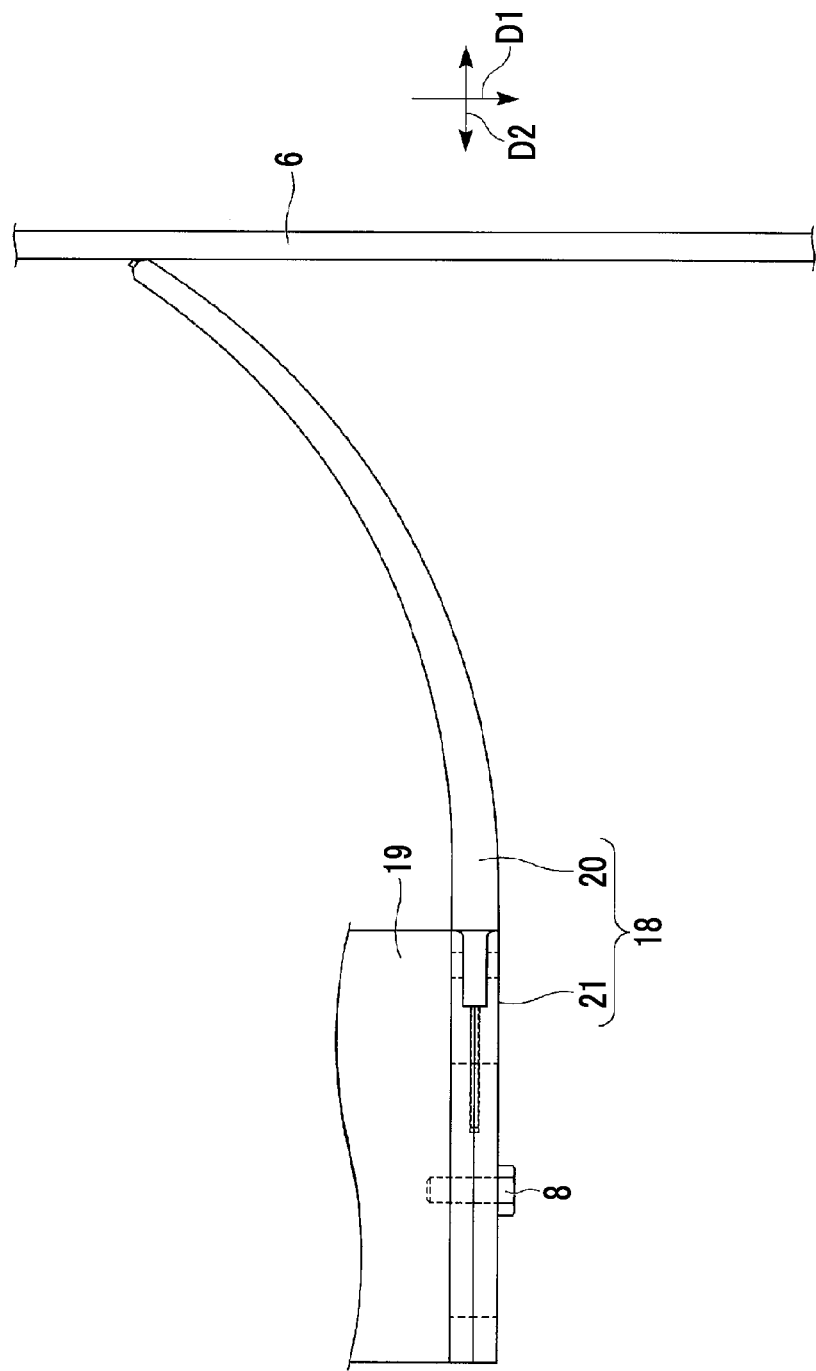

GROUNDING SHOE AND VEHICLE

RELATED APPLICATIONS

The present application is a National Phase of International Application Number PCT/JP2013/062390 filed Apr. 26, 2013, which claims priority to Japanese Application Number 2012-132980 filed Jun. 12, 2012.

TECHNICAL FIELD

The present invention relates to an antistatic grounding shoe for a vehicle. The Priority is claimed on Japanese Patent Application No. 2012-132980 filed on Jun. 12, 2012, the content of which is incorporated herein by reference in its entirety.

BACKGROUND ART

Vehicles take various forms such as a track vehicle, an electric vehicle (bus), and the like, and a track transportation system is known as new transportation means for replacing those vehicles. In the track transportation system, a vehicle travels via a travelling wheel made of a rubber tire, while guiding wheels provided in opposite side portions or in a lower portion of the vehicle are guided by grounding rails provided in opposite side portions or a center portion of a track. The track transportation system is referred to as a new transportation system, an automated people mover (APM), an automated guideway transit (AGT), or the like.

In the track transportation system, the vehicle travels via the rubber wheel, and thus the track and the vehicle are electrically insulated from each other by the rubber tire.

Accordingly, the vehicle is likely to be electrically charged due to static electricity, a leakage of electricity, or the like which occurs while travelling, and passengers may have a feeling of discomfort due to a potential difference between a station platform and the vehicle, or a potential difference inside the vehicle. With the problem being taken into consideration, for example, grounding rails are respectively provided in the side portions of the track at the station, the vehicle is provided with grounding shoes, and each of the grounding shoe is respectively in contact with the grounding rail when the vehicle is positioned at the station, thereby allowing charged electricity of the vehicle to be discharged to the outside via a ground wire that is provided in the track.

Here, PTL 1 discloses a current collector having a shape similar to that of the grounding shoe. The current collector has a configuration in which an elastic material such as rubber covers an outer circumference of a flexible electroconductive body. The current collector itself undergoes elastic deformation when sliding against a trolley wire, thereby improving followability, and maintaining current collection effects.

CITATION LIST

Patent Literature

[PTL 1] Japanese Unexamined Patent Application Publication No. 51-19572

SUMMARY OF INVENTION

Technical Problem

However, the current collector disclosed in PTL 1 is a single unit, the entirety of which has an integral structure. Accordingly, even when damage occurs to only a rubber portion, the entirety of the current collector has to be replaced, and a high cost is not avoidable.

An object of the present invention is to provide a grounding shoe that can reliably prevent a vehicle from being electrically charged, while suppressing an increase in cost.

Solution to Problem

A grounding shoe according to a first aspect of the present invention is provided in a vehicle so as to face a grounding rail provided on a track. The grounding shoe includes a collector unit that has an electroconductive body; and a holding part that fixes the collector unit by holding a first end of the electroconductive body in such a manner that the collector unit can be energized as well as attached/detached, and that is mounted in the vehicle, and that is in contact with the electroconductive body.

Due to the grounding shoe, it is possible to energize the collector unit and the grounding rail, charged electricity is allowed to flow from the vehicle to a track, it is possible to prevent electrical charges, and the collector unit is attachable and detachable from the holding part. For this reason, when damage occurs to the collector unit due to friction or the like, it is possible to replace only the damaged collector unit without the entirety of the grounding shoe being replaced. Accordingly, it is possible to reduce costs in the replacement of components.

In a second aspect of the present invention providing the grounding shoe according to the first aspect, the collector unit may further have a rubber body that covers the electroconductive body while the first end and a second end of the electroconductive body are exposed. The holding part may hold a first end of the rubber body as well as the electroconductive body.

Since the electroconductive body is covered with the rubber body, elasticity of the rubber body can improve followability when the grounding shoe is in contact with the grounding rail, and charged electricity is allowed to reliably flow to the track. Since the holding part holds not only the electroconductive body but also the rubber body, it is possible to prevent the collector unit from being pulled out of the holding part. The rubber body is only held by the holding part, and is not fixed via the bolts or the like that passes through the rubber body. For this reason, damage caused by the concentration of stress is unlikely to occur to the rubber body, and it is possible to improve durability. Accordingly, it is possible to reduce the frequency of replacing the rubber body, and a cost burden.

In a third aspect of the present invention providing the grounding shoe according to the second aspect, the rubber body may have regulating means by which the rubber body is regulated not to be pulled out of the holding part.

Due to the regulating means, the holding part can reliably hold the rubber body, and the collector unit can be better prevented from being pulled out of the holding part.

In a fourth aspect of the present invention providing the grounding shoe according to the third aspect, the regulating means may have a protruding portion that is provided in the rubber body and is fitted into a hole portion provided in the holding part.

Due to the regulating means, the holding part can reliably hold the rubber body, and the collector unit can be better prevented from being pulled out of the holding part.

In a fifth aspect of the present invention providing the grounding shoe according to any one of the first to fourth aspects, the holding part may have resistance reducing means that reduces contact resistance between a contact portion and the electroconductive body and that is provided in the contact portion which is in contact with the first end of the electroconductive body.

Due to the resistance reducing means, contact resistance between the holding part and the electroconductive body decreases, and charged electricity is allowed to reliably flow from the vehicle to the track.

In a sixth aspect of the present invention providing the grounding shoe according to the fifth aspect, the resistance reducing means may be a groove portion that is formed in the contact portion of the holding part, and that has grooves formed in a direction different from a direction from the first end of the electroconductive body to the second end.

Due to the resistance reducing means, the holding part meshes well with the electroconductive body, contact resistance between the holding part and the electroconductive body decreases, and charged electricity is allowed to flow from the vehicle to the track. It is possible to prevent the electroconductive body from being pulled out of the holding part.

In a seventh aspect of the present invention providing the grounding shoe according to any one of the second to sixth aspects, the rubber body, which covers the electroconductive body while the first and second ends of the electroconductive body are exposed, may include a stepped portion that is provided in the first end of the rubber body held by the holding part, and a portion of the rubber body close to the side of a track has a thickness dimension in a travelling direction of the vehicle smaller than that of the stepped portion. The surface of the holding part may be flush with the surface of the rubber body, the surfaces facing the travelling direction.

In this manner, the holding part can more reliably hold the rubber body, and the rubber body can be prevented from being pulled out of the holding part. For this reason, when the holding part is mounted in the vehicle, it is possible to obtain a degree of freedom for the attachment process, avoiding interference between an attachment bracket and the rubber body.

In an eighth aspect of the present invention providing the grounding shoe according to any one of the first to seventh aspects, in the electroconductive body held by the holding part, the first end of the electroconductive body may be thinner than the second end.

Since the electroconductive body has the shape, the holding part can reliably hold the electroconductive body, it is possible to prevent the electroconductive body from being pulled out of the holding part, and charged electricity is allowed to reliably flow from the vehicle to the track.

In a ninth aspect of the present invention providing the grounding shoe according to any one of the second to eighth aspects, the rubber body may be made of electroconductive rubber, covering the electroconductive body while the first and second ends of the electroconductive body are exposed.

Since even when the electroconductive body is worn out, and becomes to separate from the grounding rail, electroconductive rubber is used in the rubber body, it is possible to energize the grounding shoe and the grounding rail via only the rubber body. Accordingly, it is possible to reliably discharge electricity to the grounding rail.

In a tenth aspect of the present invention providing the grounding shoe according to any one of the second to ninth aspects, the rubber body, which covers the electroconductive body while the first and second ends of the electroconductive body are exposed, may have a thickness dimension in the travelling direction of the vehicle, which gradually decreases from the first end of the rubber body held by the holding part to a second end of the rubber body.

Due to the shape of the rubber body, the weight of the rubber body can be prevented from causing the second end to bend downwardly. It is possible to reliably ensure contact between the rubber body and the grounding rail. Due to the shape, the second end of the rubber body is flexible. For this reason, even when the rubber body is pressed against the grounding rail, the rubber body easily bends rearward in the travelling direction of the vehicle. Accordingly, it is possible to prevent the concentration of stress at the first end, and it is possible to improve durability. In addition, it is possible to improve contact with the grounding rail, it is possible to increase a contact area between the rubber body and the grounding rail, and it is possible to improve energization efficiencies. It is possible to absorb an impact when the second end of the rubber body is positioned at a joint of the grounding rail, thereby a passenger has a feeling of comfort during riding.

In an eleventh aspect of the present invention providing the grounding shoe according to any one of the second to tenth aspects, the holding part may be provided with a chamfered portion configured when an edge portion is chamfered which is in contact with the rubber body that covers the electroconductive body while the first and second ends of the electroconductive body are exposed. The rubber body may be provided with a contact portion that is positioned to face the chamfered portion, and that corresponds to the shape of the chamfered portion.

When the rubber body is pressed against the grounding rail, and bends rearward in the travelling direction of the vehicle, the chamfered portion and the contact portion press the edge portion of the holding part against the surface of the rubber body. Accordingly, it is possible to prevent a crack, a split, or the like from occurring to the rubber body, and it is possible to improve durability.

In a twelfth aspect of the present invention providing the grounding shoe according to any one of the second to eleventh aspects, the grounding shoe may further include a rigidity reinforcing member that is provided in the collector unit, and increases the rigidity of the bending of the collector unit in the travelling direction of the vehicle.

The rigidity reinforcing member improves the durability of the collector unit.

In a thirteenth aspect of the present invention providing the grounding shoe according to the twelfth aspect, the rigidity reinforcing member may be a metal plate that is in contact with a surface of the collector unit, the surface facing at least one of the front and the rear in the travelling direction of the vehicle.

Since the metal plate is used, it is possible to increase the rigidity of the bending of the collector unit in the travelling direction of the vehicle. Even when the collector unit is in contact with the grounding rail while the vehicle is travelling, and bends rearward in the travelling direction, it is possible to reliably improve the durability of the collector unit.

In fourteenth aspect of the present invention providing the grounding shoe according to the twelfth aspect, the rigidity reinforcing member may be a metal wire that is provided inside the rubber body so as to extend from the first end of the rubber body held by the holding part to the second end, the rubber body covering the electroconductive body while the first and second ends of the electroconductive body are exposed.

Since the metal wire is used, it is possible to increase the rigidity of the rearward bending of the collector unit in the travelling direction of the vehicle, and it is possible to reliably improve the durability of the collector unit.

A vehicle according to a fifteenth aspect of the present invention is provided with the grounding shoe according to any one of the first to fourteenth aspects.

In the vehicle, it is possible to energize the collector unit and the grounding rail, electrical charges can be prevented, and the collector unit is attachable and detachable from the holding part. For this reason, when damage occurs to the grounding shoe, it is possible to replace only the damaged collector unit without the entirety of the grounding shoe being replaced. Accordingly, it is possible to reduce a cost burden.

Advantageous Effects of Invention

In the grounding shoe and the vehicle, the collector unit can be energized, as well as attached/detached, and thus it is possible to prevent electrical charges while suppressing an increase in cost.

BRIEF DESCRIPTION OF DRAWINGS

FIG. 4A is a side view of the entirety of a collector unit of the grounding shoe in the track vehicle according to the first embodiment of the present invention.

FIG. 7 is a view illustrating a state in which the grounding shoe is in contact with the grounding rail while the track vehicle is travelling, in the track vehicle according to the first embodiment of the present invention.

DESCRIPTION OF EMBODIMENTS

Hereinafter, a track vehicle 1 (hereinafter, referred to as a vehicle 1) according to a first embodiment of the present invention will be described.

Figure 1:
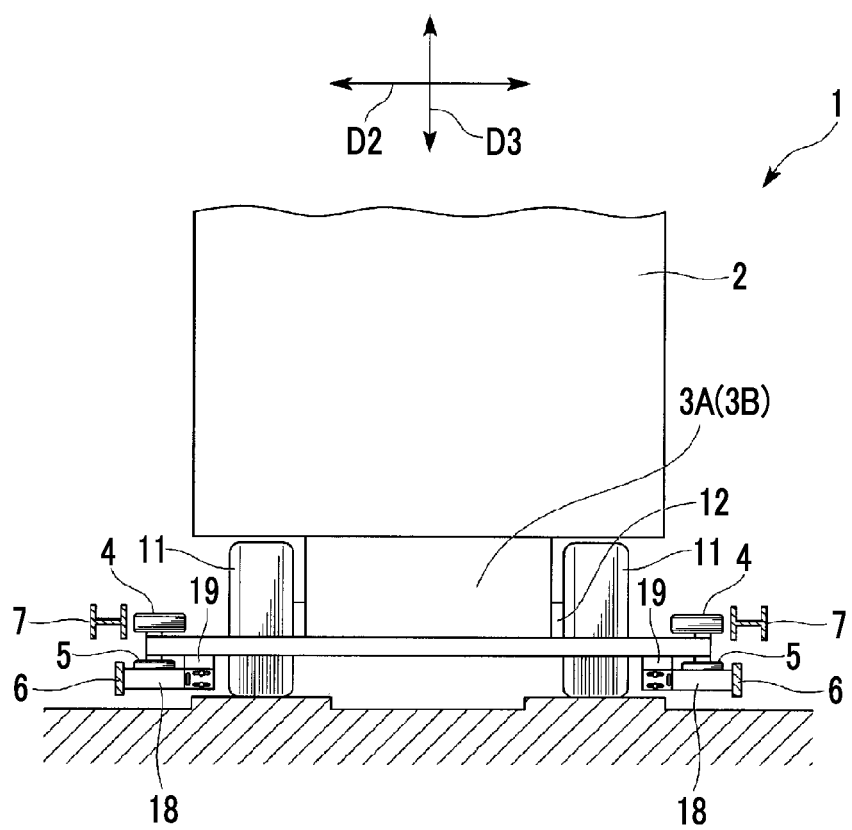
FIG. 1 is a schematic front view of a track vehicle according to a first embodiment of the present invention.
Figure 2:
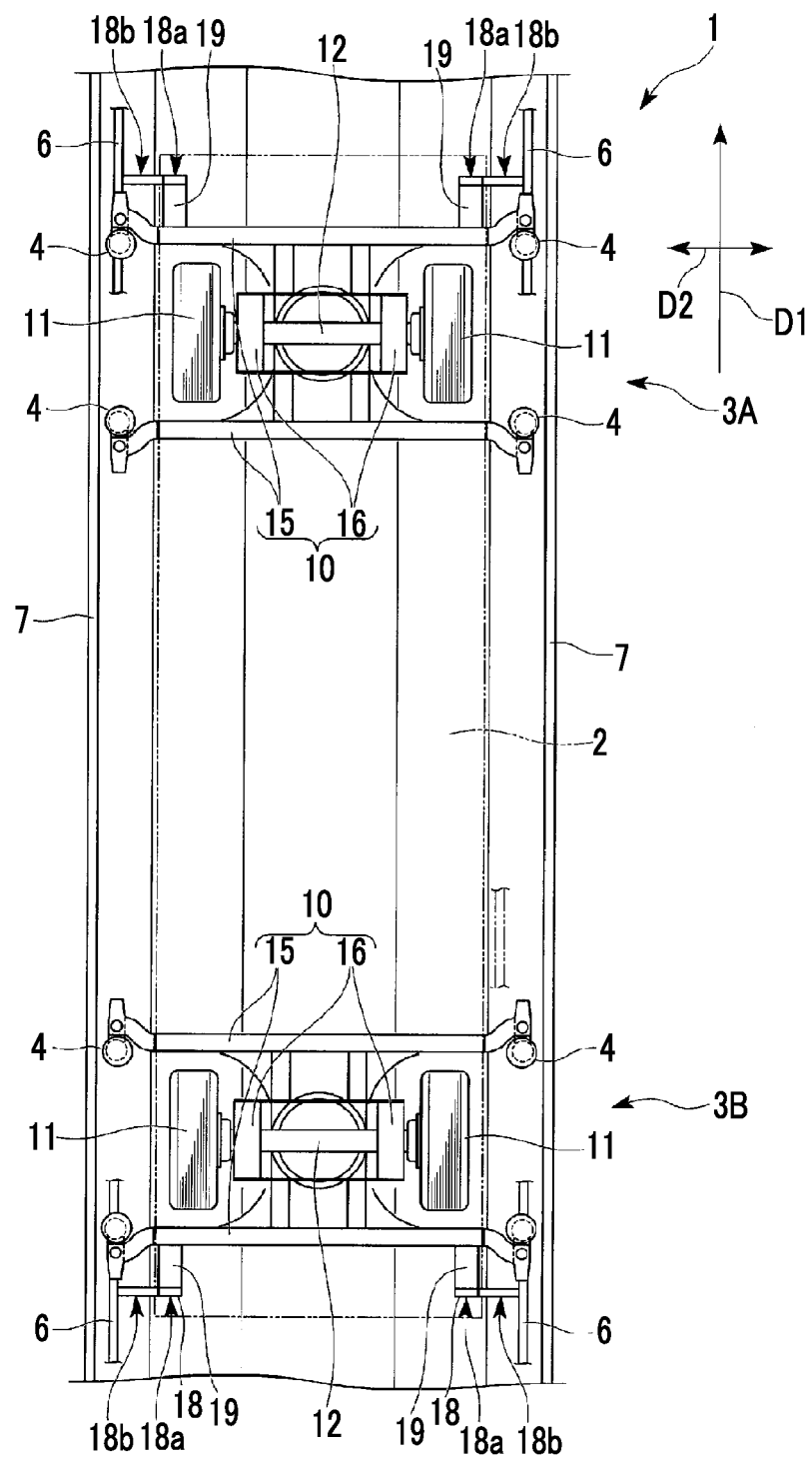
FIG. 2 is a schematic top view of a bogie of the track vehicle and a track according to the first embodiment of the present invention.
Figure 3A:
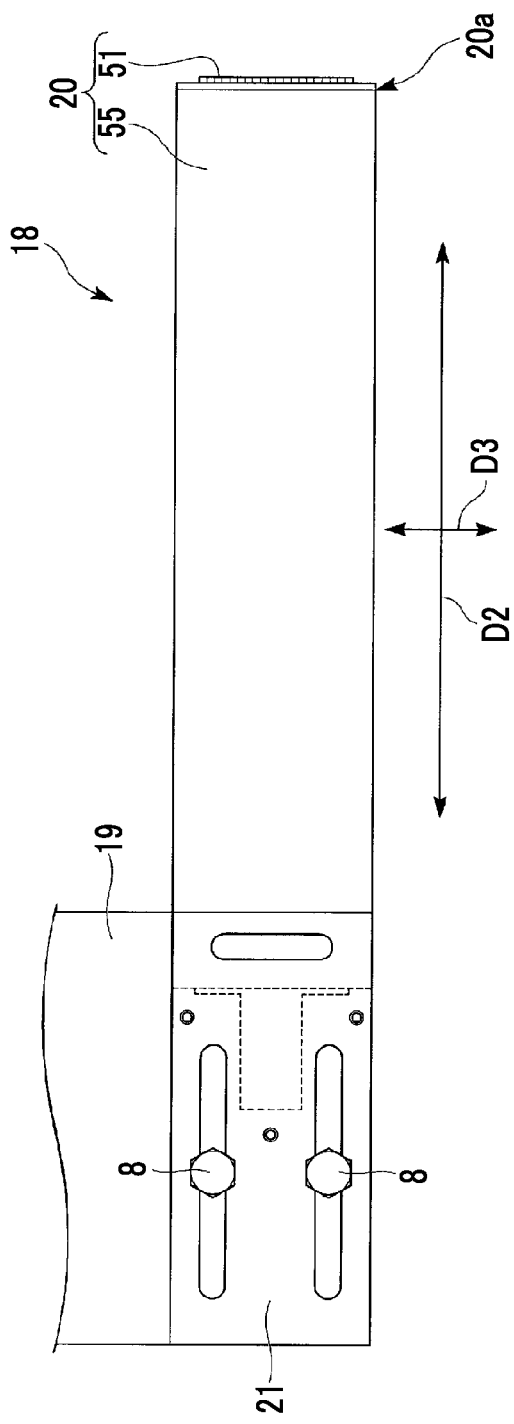
FIG. 3A is a side view of the entirety of a grounding shoe in the track vehicle according to the first embodiment of the present invention.
Figure 3B:
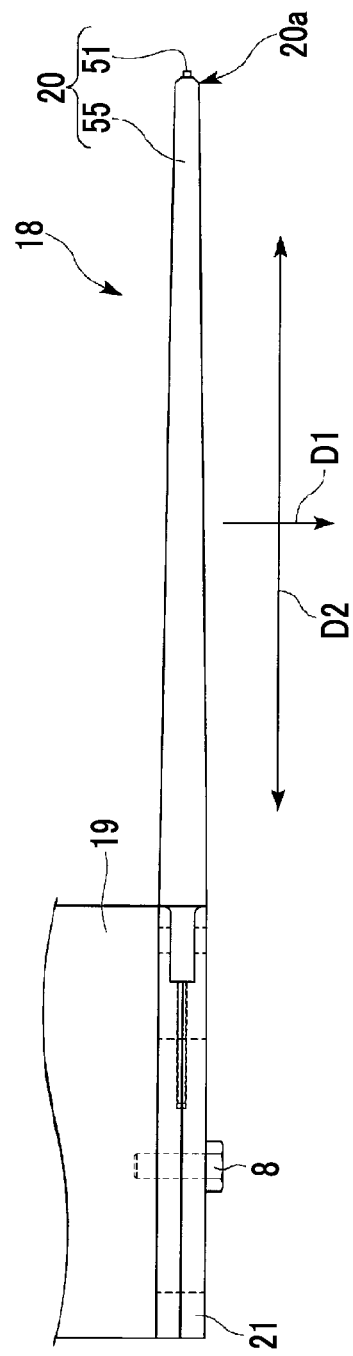
FIG. 3B is a top view of the entirety of the grounding shoe in the track vehicle according to the first embodiment of the present invention.

As illustrated in FIGS. 1 and 2, the vehicle 1 is a vehicle applied to a side-guided track transportation system in which the vehicle travels on a track while being guided by grounding rails 7 provided in opposite side portions of the track.

The vehicle 1 includes a vehicle body 2 that can accommodate passengers; bogies 3A and 3B that are provided on the underside of the vehicle body 2; and grounding shoes 18 that are provided in each of the bogies 3A and 3B.

For example, the vehicle body 2 has a rectangular parallelepiped shape, and a hollow passenger cabin that can accommodate passengers therein.

The bogies 3A and 3B are travelling devices which are respectively provided at the front and the rear underside of the vehicle body 2 in a travelling direction D1 of the vehicle 1, separately from each other. Each of the bogies 3A and 3B has a bogie frame 10 that is a frame, and travelling wheels 11 that are rubber tires which are supported by an axle 12, while being rotatable with respect to the bogie frame 10.

The bogie frame 10 has a pair of front and rear crossbeams 15 which extend in a track crosswise direction D2 orthogonal to the travelling direction D1 of the vehicle 1, and are respectively disposed at the front and the rear in the travelling direction D1, centering about the axle 12; and a pair of right and left longitudinal beams 16 in the track crosswise direction D2, which extend in the travelling direction D1, and connect the pair of front and rear crossbeams 15. A guiding wheel 4 and a switching wheel 5 disposed on the underside of the guiding wheel 4 are attached to each end of the crossbeam 15 in the track crosswise direction D2 in such a manner that the guiding wheel 4 and the switching wheel 5 can rotate about a vertical direction D3 that is a rotation axis and is orthogonal to both of the travelling direction D1 and the track crosswise direction D2.

The grounding shoe 18 is a member which is attached to each end of each of the crossbeams 15 in each of the bogies 3A and 3B in such a manner that the grounding shoe 18 does not interfere with the guiding wheel 4 and the switching wheel 5.

Specifically, in the embodiment, the grounding shoe 18 is attached to the front of the front crossbeam 15 of the front bogie 3A in the travelling direction D1 via an attachment bracket 19. In addition, the grounding shoe 18 is attached to the rear of the rear crossbeam 15 of the rear bogie 3B in the travelling direction D1 via the attachment bracket 19. That is, two grounding shoes 18 are provided in each of the bogies 3A and 3B, and four grounding shoes 18 are provided in the vehicle 1. However, the number of grounding shoes 18 is not limited to that in the embodiment. When the entirety of the vehicle 1 is electrically connected, a single grounding shoe 18 may be provided in any one of the bogies (either the bogie 3A or the bogie 3B), and a single grounding shoe 18 may be provided for the entirety of the vehicle 1.

The attachment bracket 19 is made of metal, and is electrically connected to the vehicle 1.

A first end 18a of the grounding shoe 18 is fixed to the attachment bracket 19. A second end 18b extends to the side of the track, which is proximate to the second end 18b in the track crosswise direction D2, and can be in contact with one of grounding rails 6 that are provided at the second end 18b on the track so as to face opposite side portions of the vehicle 1. The grounding rails 6 are provided at the station, and when the vehicle 1 is positioned at the station, the vehicle 1 is in contact with the grounding rails 6.

Subsequently, the grounding shoe 18 will be described in detail with reference to FIGS. 3A to 6B.

The grounding shoe 18 includes a collector unit 20 that is in contact with the grounding rail 6, and a holding part 21 that holds one end 20a of the collector unit 20, that is attached to each of the bogies 3A and 3B via the attachment bracket 19.

The collector unit 20 has a metal electroconductive body 51, and a rubber body 55 which covers the electroconductive body 51 in such a manner that the electroconductive body 51 has an exposed first end 51a and an exposed second end 51b facing the grounding rail 6.

Figure 4B:
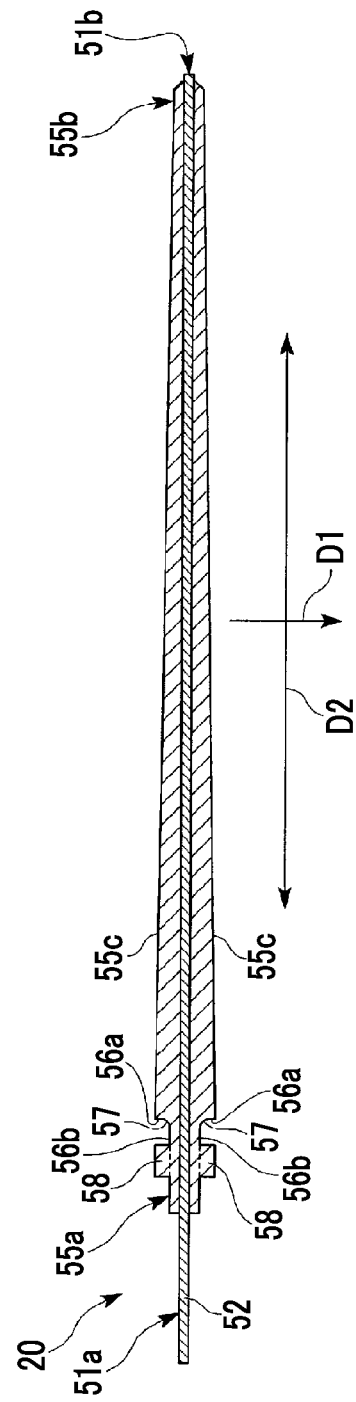
FIG. 4B is a view of the entirety of the collector unit of the grounding shoe in the track vehicle according to the first embodiment of the present invention, and is a cross-sectional view taken along line A-A in FIG. 4A.

As illustrated in FIGS. 4A and 4B, the electroconductive body 51 is configured when a plurality of metal wires are bundled in the vertical direction D3, and the first end 51a held by the holding part 21 is exposed in a state of protruding from the rubber body 55. A first end-side exposed portion 52 is formed in which only the exposed portion is thinner than other portions in the vertical direction D3. The first end-side exposed portion 52 is held and fixed by the holding part 21.

Another metal wire (not illustrated) provided inside the rubber body 55 surrounds and tightens an outer circumference of the plurality of metal wires so as to prevent the tangling of the plurality of metal wires of the electroconductive body 51 which are bundled in the vertical direction D3.

The rubber body 55 is a rubber member having conductivity, which covers an outer circumference of the electroconductive body 51. For example, a mixture of rubber and carbon, or the like is an example of electroconductive rubber. A first end 55a of the rubber body 55 held by the holding part 21 is provided with a stepped portion 56 in which two front and rear surfaces become cave in the travelling direction D1, that is, both of rubber body surfaces 55c become cave in the travelling direction D1. A portion of the rubber body 55 close to the side of the track has a thickness dimension in the travelling direction D1 smaller than that of the stepped portion 56.

The stepped portion 56 includes a stepped surface 56a connected to the rubber body surface 55c, and a bottom surface 56b connected to the stepped surface 56a. For example, an R-shaped contact portion 57 is formed in a corner portion between the stepped surface 56a and the bottom surface 56b. The stepped surface 56a is smoothly connected to the bottom surface 56b due to the contact portion 57. The contact portion 57 may have a C shape.

The bottom surface 56b of the stepped portion 56 is provided with a protruding portion (regulating means) 58 that protrudes in the travelling direction D1 up to the same height as the rubber body surface 55c. In the embodiment, the protruding portion 58 has a rectangular parallelepiped block shape in which the vertical direction D3 is a longitudinal direction thereof.

The rubber body 55 is formed in such a manner that the rubber body surfaces 55c gradually approach each other from the first end 55a to a second end 55b, that is, in such a manner that the rubber body 55 gradually decreases in thickness in the travelling direction D1.

As illustrated in FIGS. 5A, 5B, 6A, and 6B, the holding part 21 has a front holding part 22 and a rear holding part 32, each of which holds the first end 51a of the electroconductive body 51 of the collector unit 20, and the first end 55a of the rubber body 55, while interposing the first ends 51a and 55a therebetween in the travelling direction D1, and fixes the first end 51a of the electroconductive body 51.

Figure 5A:
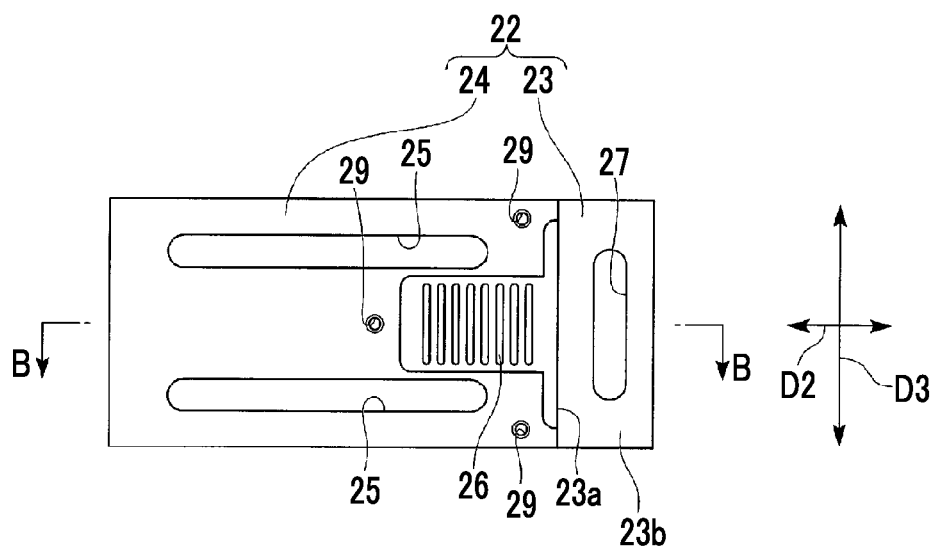
FIG. 5A is a side view of the entirety of a front holding part of the grounding shoe in the track vehicle according to the first embodiment of the present invention.
Figure 5B:
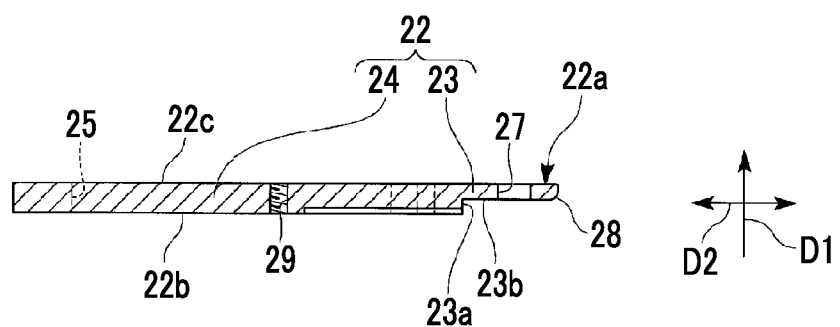
FIG. 5B is a view of the entirety of the front holding part of the grounding shoe in the track vehicle according to the first embodiment of the present invention, and is a cross-sectional view taken along line B-B in FIG. 5A.

As illustrated in FIGS. 5A and 5B, the front holding part 22 is a metal plate-shaped member that is in contact with the first end-side exposed portion 52 of the electroconductive body 51 and the first end 55a of the rubber body 55 at the front in the travelling direction D1.

Specifically, a front holding stepped portion 23 is provided in such a manner that an inner surface 22b facing rearward in the travelling direction D1 becomes cave frontward in the travelling direction D1 in an end portion 22a holding the rubber body 55. Accordingly, the front holding stepped portion 23 has a thickness dimension in the travelling direction D1, which is smaller than that of the remaining portion of the front holding part 22. That is, the front holding part 22 includes a front holding main body portion 24, and the front holding stepped portion 23 that protrudes from the front holding main body portion 24 in the track crosswise direction D2.

A groove portion (resistance reducing means) 26 is provided at substantially the center of the front holding main body portion 24 in the vertical direction D3, that is, in a position in which the front holding main body portion 24 is in contact with the first end-side exposed portion 52. The groove portion includes a plurality of grooves that are formed so as to have a length in the vertical direction D3, and be orthogonal to the track crosswise direction D2 in which the metal wires of the electroconductive body 51 extend, that is, be orthogonal to a direction from the first end 51a of the electroconductive body 51 to the second end 51b. The first end-side exposed portion 52 is in contact and meshes with the groove portion 26.

The front holding main body portion 24 is provided with first long holes 25 that extend in the track crosswise direction D2, and pass through the front holding part 22 in the travelling direction D1. The first long holes 25 are positioned so as to interpose the groove portion 26 therebetween in the vertical direction D3.

The front holding stepped portion 23 includes a front holding stepped surface 23a connected to the inner surface 22b, and a front holding bottom surface 23b connected to the front holding stepped surface 23a. The front holding bottom surface 23b is provided with a second long hole (a hole portion) 27 that passes through the front holding stepped portion 23 in the travelling direction D1, and extends in the vertical direction D3.

The bottom surface 56b of the rubber body 55 has substantially the same dimension as that of the front holding bottom surface 23b. The stepped portion 56 of the rubber body 55 is inserted perfectly into the front holding stepped portion 23.

The protruding portion 58 has substantially the same outer shape as the inner shape of the second long hole 27. The protruding portion 58 of the rubber body 55 is inserted perfectly into the second long hole 27. When the protruding portion 58 is inserted into the second long hole 27, the protruding portion 58 does not protrude from an outer surface 22c facing frontward in the travelling direction D1 of the front holding part 22, and the outer surface 22c is flush with the surface of the protruding portion 58 facing frontward in the travelling direction D1.

In the front holding part 22, the end portion 22a of the front holding stepped portion 23 in the track crosswise direction D2 has a chamfered tip edge portion in the front holding bottom surface 23b that is in contact with the bottom surface 56b of the rubber body 55 while facing the bottom surface 56b. That is, a first chamfered portion 28 is formed in the front holding part 22. When the rubber body 55 is held by the front holding part 22, the first chamfered portion 28 exactly faces the contact portion 57 of the rubber body 55. The first chamfered portion 28 may be R chamfered, or may be C chamfered. However, the first chamfered portion 28 is preferably chamfered so as to correspond to the shape of the contact portion 57. That is, when the contact portion 57 has an R shape, the first chamfered portion 28 is preferably R chamfered. When the contact portion 57 has a C shape, the first chamfered portion 28 is preferably C chamfered.

The front holding main body portion 24 of the front holding part 22 is provided with bolt holes 29, each of which has a female screw portion on an inner circumferential surface thereof that is formed in the travelling direction D1. In the embodiment, two bolt holes 29 are respectively positioned outside of the first long holes 25 in the vertical direction D3, and one bolt hole 29 is positioned inside of the groove portion 26 in the track crosswise direction D2 between the first long holes 25, and at substantially the center of the front holding part 22 in the vertical direction D3. The front holding part 22 is provided with a total of three bolt holes.

Figure 6A:
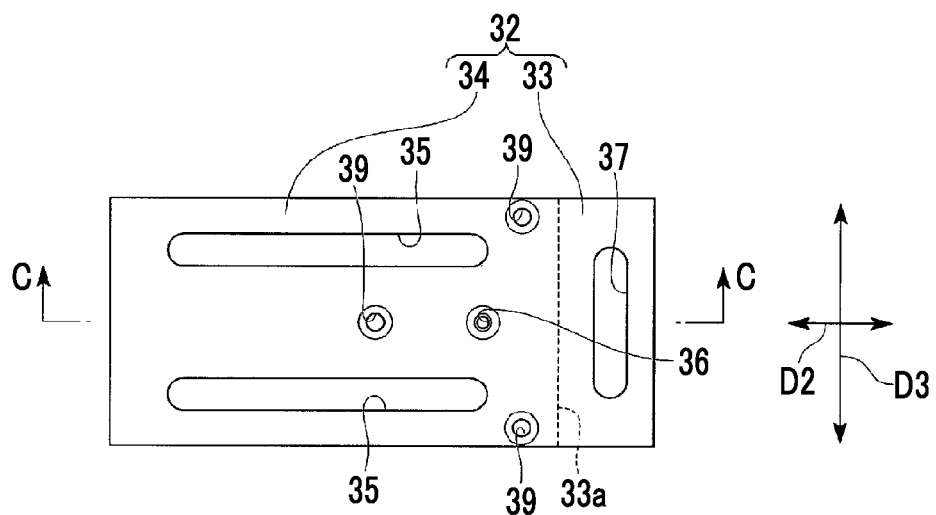
FIG. 6A is a side view of the entirety of a rear holding part of the grounding shoe in the track vehicle according to the first embodiment of the present invention.
Figure 6B:
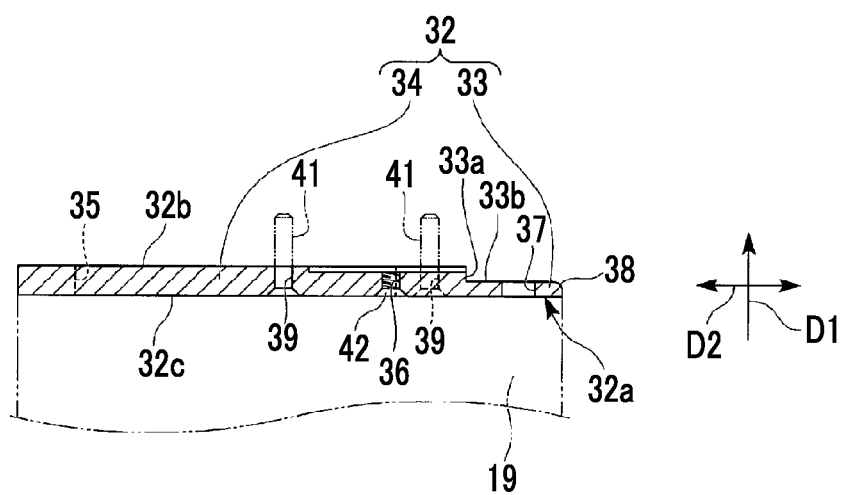
FIG. 6B is a view of the entirety of the rear holding part of the grounding shoe in the track vehicle according to the first embodiment of the present invention, and is a cross-sectional view taken along line C-C in FIG. 6A.

As illustrated in FIGS. 6A and 6B, similarly to the front holding part 22, the rear holding part 32 is a metal plate-shaped member that is in contact with the first end-side exposed portion 52 of the electroconductive body 51, and the first end 55a of the rubber body 55 at the rear in the travelling direction D1. When the rear holding part 32 is in contact with the first end-side exposed portion 52 and the first end 55a of the rubber body 55, the rear holding part 32 faces the front holding part 22, that is, the rear holding part 32 and the front holding part 22 hold the electroconductive body 51 and the rubber body 55, while interposing the electroconductive body 51 and the rubber body 55 therebetween in the travelling direction D1.

The rear holding part 32 has exactly the same exterior shape as that obtained when the front holding part 22 is reversed in the travelling direction D1. A rear holding stepped portion 33 is provided in such a manner that an inner surface 32b facing the front holding stepped portion 23, and frontward in the travelling direction D1 become cave rearward in the travelling direction D1 in an end portion 32a holding the rubber body 55. Accordingly, the rear holding stepped portion 33 has a thickness dimension in the travelling direction D1, which is smaller than that of the remaining portion of the rear holding part 32. That is, the rear holding part 32 includes a rear holding main body portion 34, and the rear holding stepped portion 33 that protrudes from the rear holding main body portion 34 in the track crosswise direction D2.

The rear holding main body portion 34 is provided with third long holes 35 that face the first long holes 25, respectively, and pass through the rear holding part 32 in the travelling direction D1. The front holding part 22 and the rear holding part 32 hold the collector unit 20, while interposing the collector unit 20 therebetween, attachment bolts 8 (refer to FIGS. 3A and 3B) are inserted through the first long holes and the third long holes 35. The grounding shoe 18 can be installed on each of the bogies 3A and 3B via the attachment bracket 19 and the attachment bolts 8.

The rear holding stepped portion 33 includes a rear holding stepped surface 33a connected to the inner surface 32b, and a rear holding bottom surface 33b connected to the rear holding stepped surface 33a. The rear holding bottom surface 33b is provided with a fourth long hole (a hole portion) 37 that passes through the rear holding stepped portion 33 in the travelling direction D1 while facing the second long hole 27 of the front holding stepped portion 23, and extends in the vertical direction D3.

The bottom surface 56b of the rubber body 55 has substantially the same dimension as that of the rear holding bottom surface 33b. That is, the stepped portion 56 of the rubber body 55 is inserted perfectly into the rear holding stepped portion 33.

The protruding portion 58 has substantially the same outer shape as the inner shape of the fourth long hole 37. The protruding portion 58 of the rubber body 55 is inserted perfectly into the fourth long hole 37. When the protruding portion 58 is inserted into the fourth long hole 37, the protruding portion 58 does not protrude from an outer surface 32c facing rearward in the travelling direction D1 of the rear holding part 32, and the outer surface 32c is flush with the surface of the protruding portion 58 facing frontward in the travelling direction D1.

In the rear holding part 32, the end portion 32a of the rear holding stepped portion 33 in the track crosswise direction D2 has a chamfered tip edge portion in the rear holding bottom surface 33b that is in contact with the bottom surface 56b of the rubber body 55 while facing the bottom surface 56b, and the chamfered tip edge portion faces the first chamfered portion 28. That is, a second chamfered portion 38 is formed in the rear holding part 32. When the rubber body 55 is held by the rear holding part 32, the second chamfered portion 38 exactly faces the contact portion 57 of the rubber body 55. The second chamfered portion 38 may be R chamfered, or may be C chamfered. However, the second chamfered portion 38 is preferably chamfered so as to correspond to the shape of the contact portion 57. That is, when the contact portion 57 has an R shape, the second chamfered portion 38 is preferably R chamfered. When the contact portion 57 has a C shape, the second chamfered portion 38 is preferably C chamfered.

The rear holding main body portion 34 of the rear holding part 32 is provided with pass-through holes 39, each of which passes through the rear holding main body portion 34 in the travelling direction D1 while respectively facing the bolt holes 29 of the front holding part 22. The pass-through hole 39 has an inner diameter greater than the outer diameter of a holding part fixing bolt 41 so as to allow the holding part fixing bolt 41 to pass through the pass-through hole 39. The pass-through hole 39 has an opening with an enlarged diameter in the outer surface 32c of the rear holding part 32, that is, the bolt head of the holding part fixing bolt 41 does not protrude from the outer surface 32c. The rear holding part 32 can be attached to the attachment bracket 19, while the outer surface 32c is in surface contact with the surface of the attachment bracket 19 of each of the bogies 3A and 3B.

In the embodiment, the holding part fixing bolt 41 is a countersunk head bolt, but insofar as the bolt head does not protrude, the holding part fixing bolt may have other shapes.

The rear holding part 32 is provided with a tap bolt hole 36 that is positioned to face the groove portion 26 of the front holding part 22, and that passes through the rear holding part 32 in the travelling direction D1. The tap bolt 42 can be screwed into the tap bolt hole 36. The tap bolt hole 36 has an opening with an enlarged diameter in the outer surface 32c, and the bolt head of a tap bolt 42 does not protrude from the outer surface 32c. Accordingly, the rear holding part 32 can be attached to the attachment bracket 19, while the outer surface 32c is in surface contact with the surface of the attachment bracket 19 of each of the bogies 3A and 3B.

In the grounding shoe 18 of the vehicle 1, the front holding part 22 and the rear holding part 32 of the holding part 21 are in contact with the first end-side exposed portion 52 of the electroconductive body 51 in the collector unit 20 in the travelling direction D1. In addition, the front holding part 22 and the rear holding part 32 are tightened together with the holding part fixing bolts 41. Accordingly, it is possible to energize the holding part 21 and the collector unit 20. Since the holding part 21 and the attachment bracket 19 are made of metal, it is possible to energize the holding part 21 and the attachment bracket 19. Furthermore, the attachment bracket 19 is electrically connected to the vehicle 1.

Accordingly, when the collector unit 20 of the grounding shoe 18 is in contact with the grounding rail 6, it is possible to energize the grounding shoe 18 and the grounding rail 6, thereby allowing electricity of the vehicle 1 charged due to static electricity to flow from the vehicle 1 to the track. In this manner, the vehicle 1 can be prevented from being electrically charged.

In addition, when the holding part fixing bolts 41 are unfastened from the holding part 21, the collector unit 20 is easily attachable and detachable therefrom. Accordingly, when damage occurs to the collector unit 20 due to friction or the like, it is possible to replace only the damaged collector unit 20 without the entirety of the grounding shoe 18 being replaced.

Since the electroconductive body 51 is covered with the rubber body 55, elasticity of the rubber body 55 can improve followability when the grounding shoe 18 is in contact with the grounding rail 6, and charged electricity is allowed to reliably flow to the track.

Since the holding part 21 holds not only the electroconductive body 51 but also the rubber body 55, and the protruding portions 58 of the rubber body 55 are respectively fitted into the second long hole 27 and the protruding portions 58 are fitted to the fourth long hole 37, the holding part 21 can more reliably hold the rubber body 55. Accordingly, it is possible to prevent the collector unit 20 from being pulled out of the holding part 21.

Since the rubber body 55 is only held by the holding part 21, and is not fixed via the holding part fixing bolts 41 and the like, damage is likely to occur to the rubber body 55. Accordingly, it is possible to improve durability, and suppress an increase in cost. Since the grounding shoe 18 is mounted in the vehicle 1 via the metal holding part 21, the attachment bolts 8 can be tightened with an appropriate tightening force, and the attachment bolts 8 are unlikely to become loose, and fall out of their positions.

Since the front holding part 22 is provided with the groove portion 26, and the first end-side exposed portion 52 of the collector unit 20 is in contact and meshes with the groove portion 26, contact resistance between the holding part 21 and the electroconductive body 51 decreases, thereby allowing charged electricity to flow from the vehicle 1 to the track. In addition, since the tap bolt 42 is screwed into the tap bolt hole 36 formed in the rear holding part 32, it is possible to press the first end-side exposed portion 52 against the groove portion 26. For this reason, the holding part 21 and the electroconductive body 51 mesh more reliably with each other. Accordingly, it is possible to further reduce the contact resistance between the holding part 21 and the electroconductive body 51, and it is possible to prevent the electroconductive body 51 from being pulled out of the holding part 21.

Since the stepped portion 56 of the rubber body 55 is fitted perfectly onto the front holding stepped portion 23 and the rear holding stepped portion 33, when the holding part 21 holds the rubber body 55, the rubber body surface 55c can be flush with the outer surface 22c of the front holding stepped portion 23 and the outer surface 32c of the rear holding stepped portion 33. Accordingly, the holding part 21 can more reliably hold the rubber body 55, and the rubber body 55 can be prevented from being pulled out of the holding part 21. For this reason, when the holding part 21 is mounted in the vehicle 1, it is possible to obtain a degree of freedom in the attachment process, while avoiding interference between the attachment bracket 19 and the rubber body 55. For example, when the collector unit 20 has a long length in the track crosswise direction D2, and a contact pressure between the collector unit 20 and the grounding rail 6 is large, the grounding shoe 18 is attached against the vehicle 1 in the track crosswise direction D2. However, even in this case, it is possible to reliably attach the grounding shoe 18, while avoiding interference between the rubber body 55 and the attachment bracket 19.

Here, in the embodiment, since the attachment bolts 8 pass through the first long holes 25 and the third long holes 35 of the holding part 21, respectively, and the grounding shoe 18 is connected to the attachment bracket 19, it is possible to obtain a degree of freedom in the track crosswise direction D2 in the installation of the grounding shoe 18.

The electroconductive body 51 has the first end-side exposed portion 52 that is thinner than other portions thereof in the vertical direction D3. However, due to this shape, it is possible to accommodate the first end-side exposed portion 52 inside of the holding part 21, and better prevent the electroconductive body 51 from being pulled out of the holding part 21. In addition, it is possible to reliably hold the electroconductive body 51, thereby energizing the grounding shoe 18 and the grounding rail 6.

Since electroconductive rubber is used in the rubber body 55, even when the electroconductive body 51 is worn out, and becomes separate from the grounding rail 6, it is possible to energize the grounding shoe 18 and the grounding rail 6 via only the rubber body 55. For this reason, it is possible to ensure redundancy and reliably prevent electrical charges, thereby improving reliability.

As illustrated in FIG. 7, when the collector unit 20 is in contact with the grounding rail 6 while the vehicle 1 is travelling, the collector unit 20 bends rearward in the travelling direction D1. Here, the rubber body 55 gradually decreases in thickness in the travelling direction D1, from the first end 51a of the electroconductive body 51 to the second end 51b. The rubber body 55 has a tapered shape. For this reason, the second end 55b of the rubber body 55 is flexible. Even when the rubber body 55 is pressed against the grounding rail 6, the rubber body 55 easily bends rearward in the travelling direction D1 of the vehicle 1. Accordingly, it is possible to prevent the concentration of stress at the first end 55a held by the holding part 21, and it is possible to improve durability.

Due to the tapered shape of the rubber body 55, the weight of the rubber body 55 can be prevented from causing the second end 55b to bend downwardly. It is possible to reliably ensuring contact between the rubber body 55 and the grounding rail 6. The tapered shape can increase a contact area between the rubber body 55 and the grounding rail 6, and improve energization efficiencies. It is possible to absorb an impact when the second end 55b of the rubber body 55 is positioned at a joint of the grounding rail 6, and thus a passenger has a feeling of comfort during riding.

When the rubber body 55 is pressed against the grounding rail 6, and bends rearward in the travelling direction D1 of the vehicle 1, the edge portion of the end portion 22a of the front holding part 22 is pressed against the surface of the rubber body 55. In addition, the edge portion of the end portion 32a of the rear holding part 32 is pressed against the surface of the rubber body 55. Even in this case, the following can prevent a crack, a split, or the like from occurring to the rubber body 55: the first chamfered portion 28 of the front holding part 22; the second chamfered portion 38 of the rear holding part 32; and the contact portion 57 of the rubber body 55, which are in contact with the first chamfered portion 28 and the second chamfered portion 38. Accordingly, it is possible to improve the durability of the grounding shoe 18.

Subsequently, a vehicle 100 according to a second embodiment of the present invention will be described.

The same reference signs are assigned to the same configuration elements as those of the first embodiment, and the description thereof will be omitted.

In the embodiment, the second embodiment is different from the first embodiment in that a grounding shoe 108 further includes a rigidity reinforcing member 110.

Figure 8A:
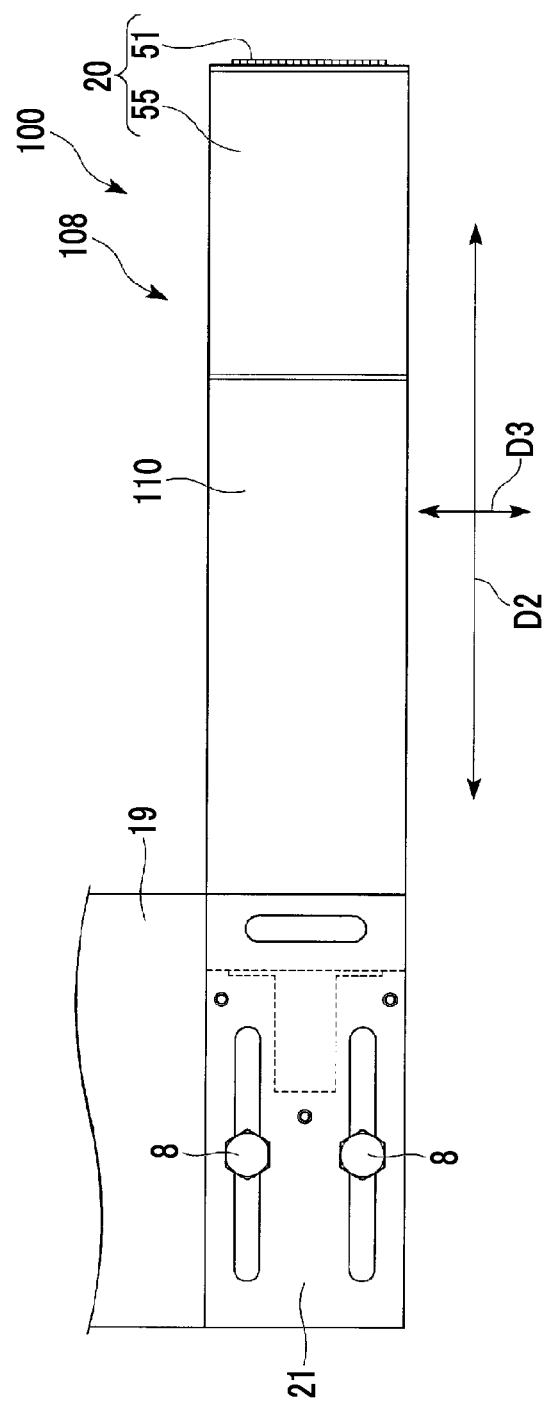
FIG. 8A is a side view of the entirety of a grounding shoe in a track vehicle according to a second embodiment of the present invention.
Figure 8B:
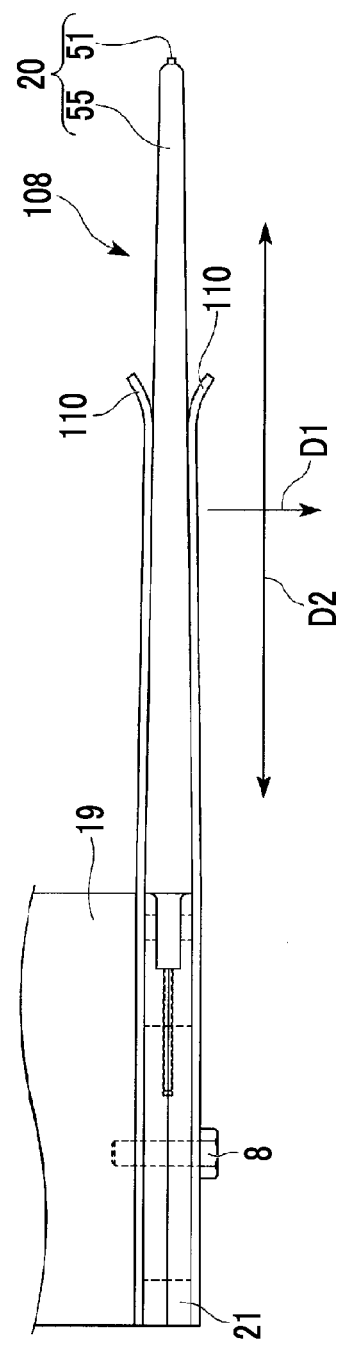
FIG. 8B is a top view of the entirety of the grounding shoe in the track vehicle according to the second embodiment of the present invention.

As illustrated in FIGS. 8A and 8B, the rigidity reinforcing member 110 is a metal plate that is in contact with the respective outer surfaces 22c and 32c of the front holding part 22 and the rear holding part 32, and with the rubber body surface 55c in the collector unit 20 at the front and the rear in the travelling direction D1 of the vehicle 100.

In the grounding shoe 108, since the rigidity reinforcing member 110 is made of a metal plate, even when the collector unit 20 bends rearward in the travelling direction D1 of the vehicle 100 as described above, it is possible to increase the rigidity of the bending in the travelling direction D1, and it is possible to reliably improve the durability of the collector unit 20.

The rigidity reinforcing member 110 may not be provided on both front and rear sides of the grounding shoe 108 in the travelling direction D1, and for example, may be provided in only one side in the travelling direction D1.

Figure 9A:
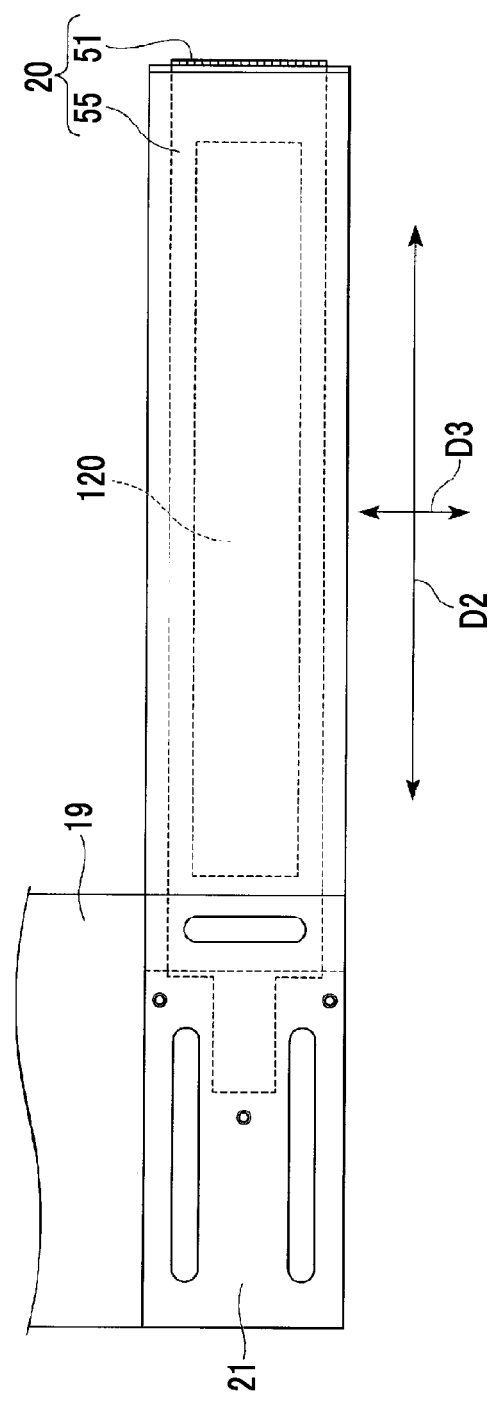
FIG. 9A is a side view of the entirety of the grounding shoe in the track vehicle according to a modification example of the second embodiment of the present invention.
Figure 9B:
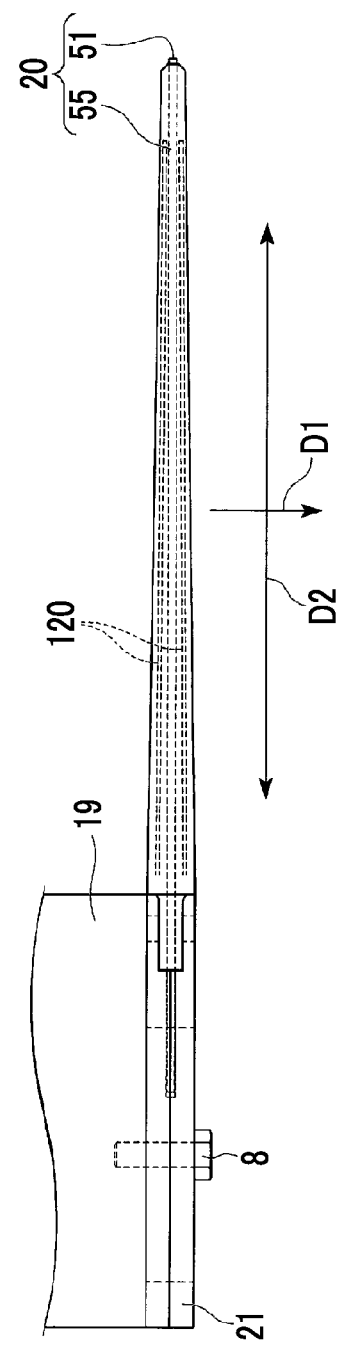
FIG. 9B is a top view of the entirety of the grounding shoe in the track vehicle according to the modification example of the second embodiment of the present invention.

As illustrated in FIGS. 9A and 9B, a rigidity reinforcing member 120 may be metal wires that are provided inside the rubber body 55 so as to extend from the first end 51a to the second end 51b in the track crosswise direction D2. The rigidity reinforcing members 120 may be provided at any location on the inside of the rubber body 55, but for example, the rigidity reinforcing members 120 can be provided in such a manner that the electroconductive body 51 is interposed therebetween in the travelling direction D1, and that the metal wires are bundled in the vertical direction D3. Even when the metal wires are used in the rigidity reinforcing member 120 and the collector unit 20 bends rearward in the travelling direction D1 of the vehicle 100, it is possible to increase the rigidity of the bending in the travelling direction D1.

As such, the embodiments of the present invention are described, but modifications can be made in various forms insofar as the modifications do not deportion from the technical idea of the present invention.

For example, in the embodiments, the groove portion 26 is provided in only the front holding part 22, but may be also provided in the rear holding part 32. The groove portion 26 may be provided in only the rear holding part 32.

The grooves of the groove portion 26 are preferably formed in a direction different from the track crosswise direction D2 in which the metal wires of the first end-side exposed portion 52 extend. The grooves may be formed to be orthogonal to the track crosswise direction D2. For example, the plurality of grooves may not be formed in the same direction, but may be formed to have a grid pattern. A simple rough surface may be provided instead of the groove portion 26. The first end-side exposed portion 52 preferably meshes well with the grooves.

The tap bolt hole 36 may not be provided.

The three bolt holes 29 and the three pass-through holes 39 are provided, but insofar as the holding part 21 can fix the collector unit 20, the number of bolt holes 29 and pass-through holes 39 are not limited. With regard to the installation positions, the bolt holes 29 and the pass-through holes 39 are preferably provided in at least the front holding main body portion 24, and the rear holding main body portion 34. The installation positions are not limited to the embodiments.

Instead of the protruding portion 58 of the rubber body 55, and the second long hole 27 and the fourth long hole 37 of the holding part 21, the rubber body 55 may be provided with a hole portion, the holding part 21 may be provided with a protruding portion, and the hole portion and protruding portion may be fitted together. The respective shapes of the protruding portion 58, the second long hole 27, and the fourth long hole 37 are not limited to those in the embodiments.

The tap bolt hole 36 is provided at only one location in substantially the center portion of a range of the rear holding part 32 facing the groove portion 26, but a plurality of tap bolt holes 36 may be provided insofar as the positioning is in the range facing the groove portion 26.

In the embodiment, the collector unit 20 includes the electroconductive body 51 and the rubber body 55 that covers the electroconductive body 51, but for example, may include only the electroconductive body 51.

The vehicles 1 and 100 of the embodiments are applied to the side-guided track transportation system, but may be applied to a center-guided track transportation system.

The front holding part 22 and the rear holding part 32 may not be fixed together with the holding part fixing bolts 41, but for example, may be fixed via engaging portions that have claws engaging with each other.

INDUSTRIAL APPLICABILITY

The present invention relates to the antistatic grounding shoe for a vehicle. In the grounding shoe of the present invention, the collector unit can be energized, as well as attached/detached, and thus it is possible to prevent electrical charges while suppressing an increase in cost.

REFERENCE SIGNS LIST

1: vehicle
2: vehicle body
3A, 3B: bogie
4: guiding wheel
5: switching wheel
6: grounding rail
8: attachment bolt
10: bogie frame
11: travelling wheel
12: axle
15: crossbeam 16: longitudinal beam
18: grounding shoe
19: attachment bracket
20: collector unit
21: holding part
22: front holding part
22b: inner surface
22c: outer surface
23: front holding stepped portion
23a: front holding stepped surface
23b: front holding bottom surface
24: front holding main body portion
25: first long hole
26: groove portion (resistance reducing means)
27: second long hole (hole portion)
28: first chamfered portion
29: bolt hole
32: rear holding part
32b: inner surface
32c: outer surface
33: rear holding stepped portion
33a: rear holding stepped surface
33b: rear holding bottom surface
34: rear holding main body portion
35: third long hole
36: tap bolt hole
37: fourth long hole (hole portion)
38: second chamfered portion
39: pass-through hole
41: holding part fixing bolt
42: tap bolt
51: electroconductive body
52: first end-side exposed portion
55: rubber body
55c: rubber body surface
56: stepped portion
56a: stepped surface
56b: bottom surface
57: contact portion
58: protruding portion (regulating means)
D1: travelling direction
D2: track crosswise direction
D3: vertical direction
100: vehicle
108: grounding shoe
110: rigidity reinforcing member
120: rigidity reinforcing member

The invention claimed is:

1. A grounding shoe that is provided in a vehicle so as to face a grounding rail provided on a track, the grounding shoe comprising:
a collector unit that has an electroconductive body; and
a holding part that fixes the collector unit by holding a first end of the electroconductive body in such a manner that the collector unit can be energized as well as attached/detached, and that is mounted in the vehicle, and that is in contact with the electroconductive body,
wherein the collector unit further has a rubber body that covers the electroconductive body while the first end and a second end of the electroconductive body are exposed, and
wherein the holding part holds a first end of the rubber body as well as the electroconductive body.

2. The grounding shoe according to claim 1,
wherein the rubber body has regulating means by which the rubber body is regulated not to be pulled out of the holding part.

3. The grounding shoe according to claim 2,
wherein the regulating means has a protruding portion that is provided in the rubber body and is fitted into a hole portion provided in the holding part.

4. The grounding shoe according to claim 1,
wherein the rubber body, which covers the electroconductive body while the first and second ends of the electroconductive body are exposed, includes a stepped portion is provided in the first end of the rubber body held by the holding part, and a portion of the rubber body close to the side of a track has a thickness dimension in a travelling direction of the vehicle smaller than that of the stepped portion, and
wherein the surface of the holding part is flush with the surface of the rubber body, the surfaces facing the travelling direction.

5. The grounding shoe according to claim 1,
wherein, in the electroconductive body held by the holding part, the first end of the electroconductive body is thinner than the second end.

6. The grounding shoe according to claim 1,
wherein the rubber body is made of electroconductive rubber, covering the electroconductive body while the first and second ends of the electroconductive body are exposed.

7. The grounding shoe according to claim 1,
wherein the rubber body, which covers the electroconductive body while the first and second ends of the electroconductive body are exposed, has a thickness dimension in the travelling direction of the vehicle, which gradually decreases from the first end of the rubber body held by the holding part to a second end of the rubber body.

8. The grounding shoe according to claim 1,
wherein the holding part is provided with a chamfered portion configured when an edge portion is chamfered which is in contact with the rubber body that covers the electroconductive body while the first and second ends of the electroconductive body are exposed, and
wherein the rubber body is provided with a contact portion that is positioned to face the chamfered portion, and that corresponds to the shape of the chamfered portion.

9. A grounding shoe that is provided in a vehicle so as to face a grounding rail provided on a track, the grounding shoe comprising:
a collector unit that has an electroconductive body; and
a holding part that fixes the collector unit by holding a first end of the electroconductive body in such a manner that the collector unit can be energized as well as attached/detached, and that is mounted in the vehicle, and that is in contact with the electroconductive body,
wherein the holding part has resistance reducing means that reduces contact resistance between a contact portion and the electroconductive body and that is provided in the contact portion which is in contact with the first end of the electroconductive body, and
wherein the resistance reducing means is a groove portion that is formed in the contact portion of the holding part, and that has grooves formed in a direction different from a direction from the first end of the electroconductive body to the second end.

10. A collector unit of a grounding shoe that is provided in a vehicle so as to face a grounding rail provided on a track, the collector unit comprising:
an electroconductive body which is fixed by a first end thereof being held by a holding part mounted in the vehicle in such a manner that the electroconductive body is capable of being energized as well as attached/detached, and which is in contact with the holding part;

a rubber body which covers the electroconductive body while the first end and a second end of the electroconductive body are exposed and of which a first end is hold by the holding part.

11. The collector unit according to claim 10, wherein the rubber body has regulating means by which the rubber body is regulated not to be pulled out of the holding part.

12. The collector unit according to claim 11, wherein the regulating means has a protruding portion that is provided in the rubber body and is fitted into a hole portion provided in the holding part.

13. The collector unit according to claim 10, wherein the rubber body, which covers the electroconductive body while the first and second ends of the electroconductive body are exposed, includes a stepped portion is provided in the first end of the rubber body held by the holding part, and a portion of the rubber body close to the side of a track has a thickness dimension in a travelling direction of the vehicle smaller than that of the stepped portion, and wherein the surface of the holding part is flush with the surface of the rubber body, the surfaces facing the travelling direction.

14. The collector unit according to claim 10, wherein, in the electroconductive body held b the holding part, the first end of the electroconductive body is thinner than the second end.

15. The collector unit according to claim 10, wherein the rubber body is made of electroconductive rubber.

16. The collector unit according to claim 10, wherein the rubber body has a thickness dimension in the travelling direction of the vehicle, which gradually decreases from the first end of the rubber body held by the holding part to a second end of the rubber body.

17. The collector unit according to claim 10, wherein the rubber body is provided with a contact portion, wherein the contact portion is positioned to face a chamfered portion being provided on the holding part and being configured when an edge portion is chamfered which is in contact with the rubber body, and wherein the contact portion corresponds to the shape of the chamfered portion.

18. The collector unit according to claim 10, wherein a rigidity reinforcing member is provided, and wherein the rigidity reinforcing member increases the rigidity of the bending in the travelling direction of the vehicle.

19. The collector unit according to claim 18, wherein the rigidity reinforcing member is a metal plate that is in contact with a surface of the rubber body, the surface facing at least one of the front and the rear in the travelling direction of the vehicle.

20. The collector unit according to claim 18, wherein the rigidity reinforcing member is a metal wire that is provided inside the rubber body so as to extend from the first end of the rubber body held by the holding part to the second end.

* * * * *